(12) United States Patent
Ribarich

(10) Patent No.: US 9,837,904 B2
(45) Date of Patent: Dec. 5, 2017

(54) VOLTAGE CONVERTER WITH VCC-LESS RDSON CURRENT SENSING CIRCUIT

(71) Applicant: Infineon Technologies Americas Corp., El Segundo, CA (US)

(72) Inventor: Thomas J. Ribarich, Laguna Beach, CA (US)

(73) Assignee: INFINEON TECHNOLOGIES AMERICAS CORP., El Segundo, CA (US)

( * ) Notice: Subject to any disclaimer, the term of this patent is extended or adjusted under 35 U.S.C. 154(b) by 0 days.

(21) Appl. No.: 15/275,005

(22) Filed: Sep. 23, 2016

(65) Prior Publication Data

US 2017/0012533 A1 Jan. 12, 2017

Related U.S. Application Data

(63) Continuation of application No. 14/491,093, filed on Sep. 19, 2014, now Pat. No. 9,453,859.

(60) Provisional application No. 61/901,095, filed on Nov. 7, 2013.

(51) Int. Cl.
*H02M 3/158* (2006.01)
*G01R 19/00* (2006.01)
*G01R 31/40* (2014.01)
*H02M 3/155* (2006.01)
*H03K 17/082* (2006.01)
*H02M 1/088* (2006.01)
*H02M 1/00* (2006.01)

(52) U.S. Cl.
CPC ........ *H02M 3/158* (2013.01); *G01R 19/0084* (2013.01); *G01R 19/0092* (2013.01); *G01R 31/40* (2013.01); *H02M 1/088* (2013.01); *H02M 3/155* (2013.01); *H03K 17/0822* (2013.01); *H02M 2001/0009* (2013.01); *H03K 2217/0027* (2013.01)

(58) Field of Classification Search
CPC ...... H02M 3/158; H02M 3/155; H02M 1/088; G01R 31/40; G01R 10/0092
See application file for complete search history.

(56) References Cited

U.S. PATENT DOCUMENTS

| | | | | |
|---|---|---|---|---|
| 5,144,172 A | * | 9/1992 | Palara | G05F 3/22 327/322 |
| 5,422,593 A | * | 6/1995 | Fujihira | G05F 1/573 327/427 |
| 5,739,712 A | | 4/1998 | Fujii | |
| 5,844,760 A | * | 12/1998 | Kumagai | G05F 1/569 361/18 |
| 7,138,786 B2 | | 11/2006 | Ishigaki et al. | |

(Continued)

*Primary Examiner* — Emily P Pham
(74) *Attorney, Agent, or Firm* — Slater Matsil, LLP

(57) ABSTRACT

In one implementation, a voltage converter includes a driver providing a gate drive for a power switch and a sense circuit coupled across the power switch. The gate drive provides power to the sense circuit, and the sense circuit provides a sense output to the driver corresponding to a current through the power switch. In one implementation, the sense circuit includes a high voltage (HV) sense transistor coupled between a first sense input and a sense output, a delay circuit configured to be coupled to the gate drive to provide power to the HV sense transistor when the gate drive is high, and a pull-down transistor configured to couple the sense output to a second sense input when the gate drive is low.

20 Claims, 4 Drawing Sheets

(56) References Cited

U.S. PATENT DOCUMENTS

| | | |
|---|---|---|
| 7,245,116 B2 | 7/2007 | Tateno et al. |
| 7,420,356 B2 | 9/2008 | Hojo |
| 7,928,703 B2 | 4/2011 | Tan et al. |
| 8,368,363 B2 | 2/2013 | Nishida |
| 2005/0057228 A1 | 3/2005 | Shih |
| 2009/0273874 A1* | 11/2009 | Yen .................. H02H 7/1203 361/93.9 |
| 2010/0134080 A1* | 6/2010 | Ouyang ............ H02M 3/158 323/282 |
| 2011/0182090 A1 | 7/2011 | Huang |
| 2012/0007613 A1 | 1/2012 | Gazit |
| 2013/0175542 A1 | 7/2013 | Briere et al. |

\* cited by examiner

PRIOR ART

VOLTAGE CONVERTER WITH VCC-LESS RDSON CURRENT SENSING CIRCUIT

CROSS-REFERENCE TO RELATED APPLICATIONS

This application is a continuation of U.S. application Ser. No. 14/491,093, filed on Sep. 19, 2014 and issued on Sep. 27, 2016 as U.S. Pat. No. 9,453,859, which claims the benefit of U.S. Provisional Application No. 61/901,095, filed on Nov. 7, 2013, which application is hereby incorporated herein by reference.

BACKGROUND

Switched-mode power converters are used in a variety of electronic circuits and systems requiring conversion of a direct current (DC) input to a lower, or higher, DC output. For example, a switched-mode power converter may be implemented as a voltage converter, such as a buck converter, to convert a higher voltage DC input to a lower voltage DC output for use in low voltage applications in which relatively large output currents are required.

Switched-mode voltage converters typically include a current sense element or elements in series with one or more of the voltage converter power switches, as well as circuitry for monitoring the power switch current levels. This may be necessary to protect the power switch or switches from exposure to possibly damaging high peak currents. In a conventional solution for implementing current sensing, a low value ohmic resistor typically serves as the current sense element and is situated between the power switch and ground. However, power losses across such a conventional resistive current sense element can be large. In addition, system cost and size can increase significantly due to necessary additional components needed to implement a conventional resistive current sense element in applications in which very high currents are being switched and/or multiple sensing resistors requiring heat sinking are used.

SUMMARY

The present disclosure is directed to a voltage converter with VCC-less RDSon current sensing circuit, substantially as shown in and/or described in connection with at least one of the figures, and as set forth more completely in the claims.

DETAILED DESCRIPTION OF ILLUSTRATIVE EMBODIMENTS

Figure 1:
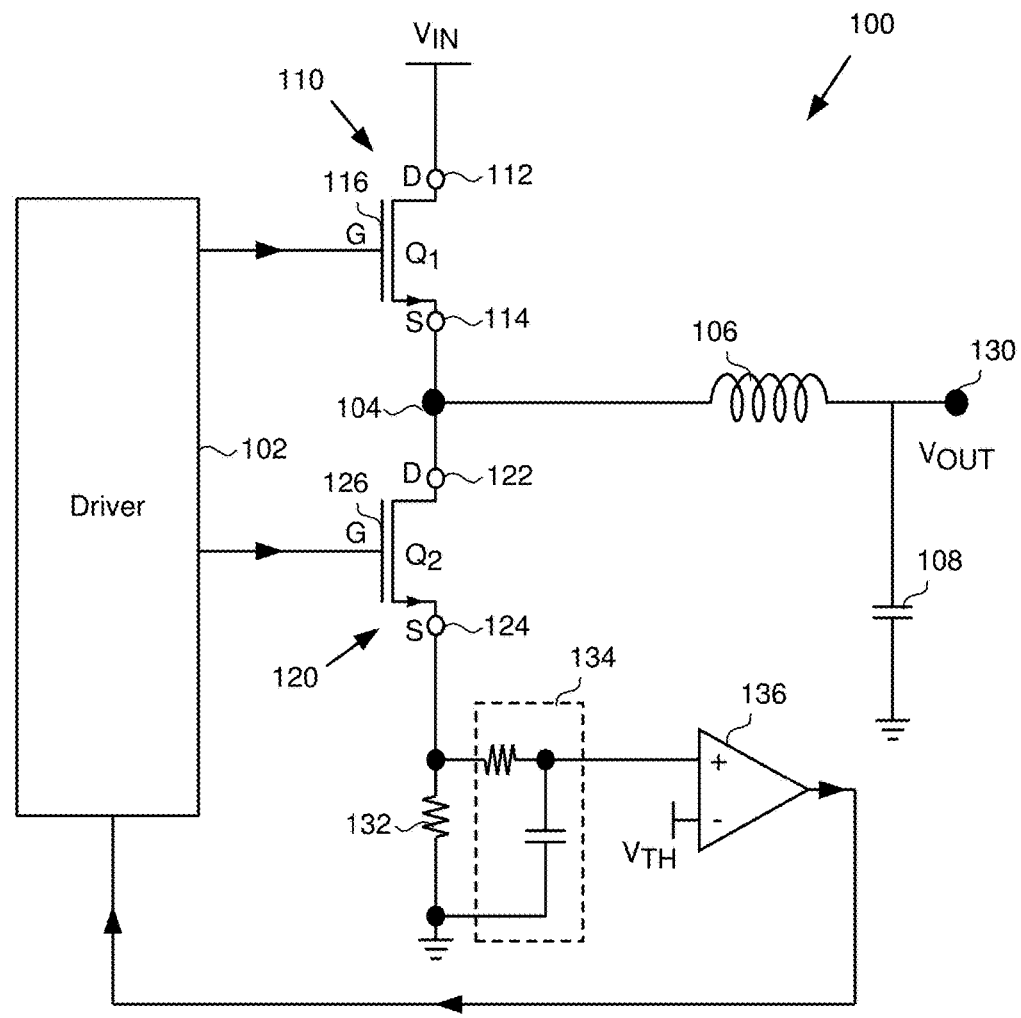
FIG. 1 shows a diagram of a voltage converter implementing a conventional approach to current sensing for a low side power switch.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, switched-mode voltage converters typically include a current sense element or elements in series with one or more of the power switches of the voltage converter, as well as circuitry for monitoring the power switch current levels. This may be necessary to protect the power switch or switches from exposure to possibly damaging high peak currents. According to a conventional approach to implementing current sensing, a low value ohmic resistor typically serves as the current sense element and is connected between the power switch and ground.

FIG. 1 shows a diagram of voltage converter 100 implementing such a conventional approach to current sensing for a low side power switch. Voltage converter 100 includes high side power switch 110 (Q1) in the form of a silicon metal-oxide-semiconductor field-effect transistors (MOSFET) and low side power switch 120 (Q2), also shown as a silicon MOSFET, (hereinafter "high side power MOSFET 110" and "low side power MOSFET 120"). As shown in FIG. 1, high side power MOSFET no includes drain 112, source 114, and gate 116, while low side power MOSFET 120 includes drain 122, source 124, and gate 126. Voltage converter 100 also includes driver 102 configured to drive gates 116 and 126 of respective high side and low side power MOSFETs no and 120.

Voltage converter 100 also includes sense resistor 132 providing current sensing for low side power MOSFET 120. Sense resistor 132 is monitored by circuitry including R-C filter 134 and comparator 136 configured to provide a sense signal to driver 102. Also shown in FIG. 1 are voltage converter switch node 104, output inductor 106, output capacitor 108, and output node 130.

The conventional current sensing approach shown in FIG. 1 uses a low ohmic resistor as current sense resistor 132 connected between source 124 of low side power MOSFET 120 and ground. When low side power MOSFET 120 is on, current flows from drain 122 to source 124 of low side power MOSFET 120, and then through sense resistor 132 to ground. It is noted that output inductor 106 causes the current through low side power MOSFET 120 and sense resistor 132 to ramp up in a substantially linear fashion over time. There is also typically a turn-on current spike due to the gate-to-source current of low side power MOSFET 120 that flows through sense resistor 132 during the rising edge of the gate drive received at gate 126 of low side power MOSFET 120. When low side power MOSFET 120 turns off, current no longer flows through low side power MOSFET 120, causing the voltage across sense resistor 132 to drop to substantially zero.

In order to provide cycle-by-cycle over-current protection for low side power MOSFET 120 according to the conventional approach depicted in FIG. 1, the voltage across sense resistor 132 is typically filtered through R-C filter 134 to eliminate the turn-on spike. That filtered current sense voltage and is then fed to the positive input to comparator 136, where it is compared to a predetermined threshold voltage VTH tied to the negative input to comparator 136. When the filtered current sense voltage reaches VTH, the output of comparator 136 goes high and is used by driver 102 as a signal to turn low side power MOSFET 120 off.

However, the conventional current sensing approach represented in FIG. 1 can undesirably result in relatively large power losses through sense resistor 132. Although these power losses depend on the resistance value of sense resistor 132, as well as VTH and the current flowing through sense resistor 132, they inevitably reduce the efficiency of voltage converter 100, particularly in applications in which very high currents are being switched. Moreover, the heat produced by sense resistor 132 may further undesirably require implementation of thermal management techniques, such as use of a heat sink.

The present application is directed to voltage converters including one or more gate drive powered current sense circuit(s) designed to overcome the deficiencies in conventional current sensing solutions. The present application discloses a novel and inventive current sense circuit configured to utilize the on-resistance of the power switch being monitored, for example, the RDSon of a power MOSFET or other type of power FET, to sense the current through the power switch. As a result, the approach disclosed herein advantageously enables omission of a conventional current sense element connected in series with the power switch, thereby eliminating the power losses associated with such a conventional current sense element. In addition, the current sense circuit disclosed herein is configured to be powered by the gate drive for the power switch being sensed, thereby advantageously eliminating the need for a dedicated VCC input to the current sense circuit.

Figure 2:
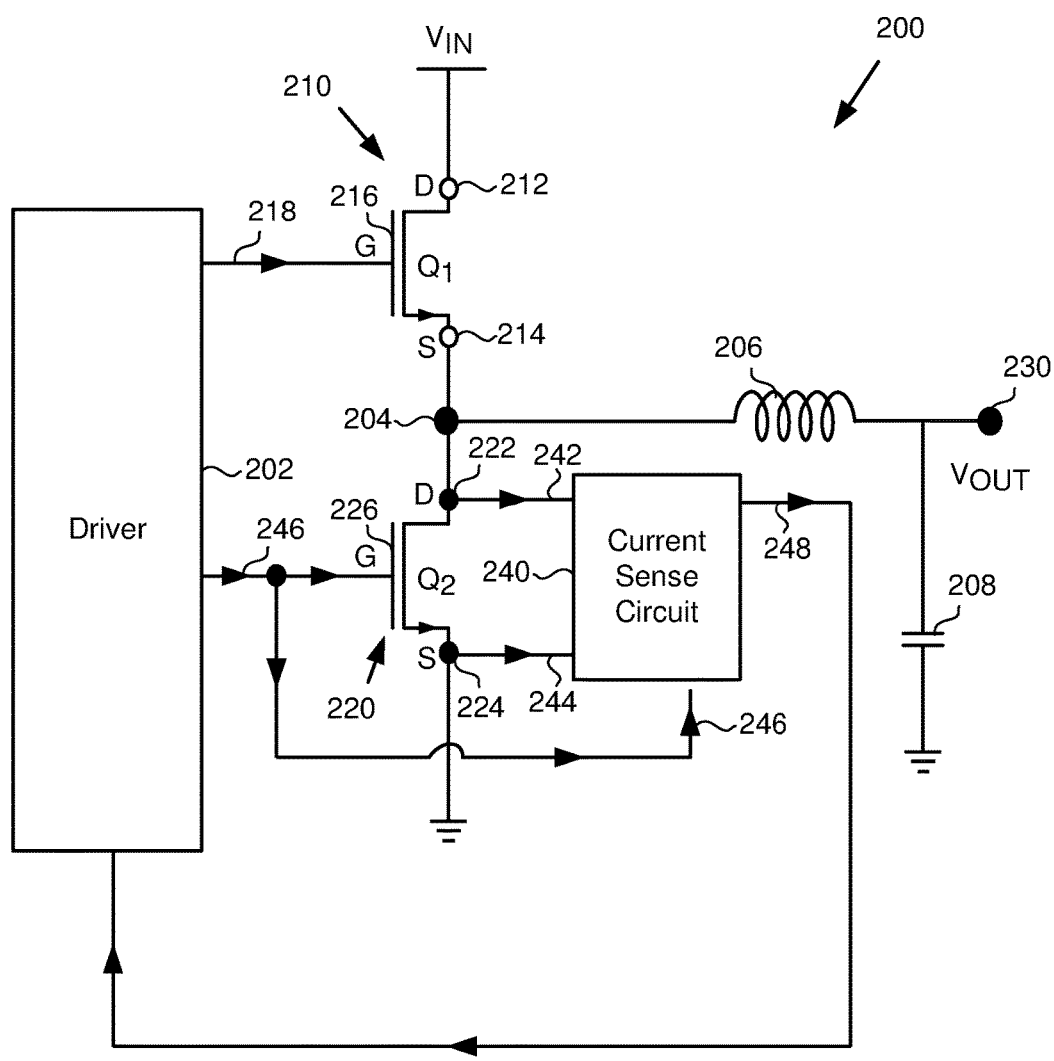
FIG. 2 shows a diagram of an exemplary voltage converter including a gate drive powered current sense circuit, according to one implementation.

Referring to FIG. 2, FIG. 2 shows a diagram of exemplary voltage converter 200 including gate drive powered current sense circuit 240 (hereinafter "current sense circuit 240", or simply the "sense circuit"), according to one implementation. Voltage converter 200 includes high side power switch 210 (Q1), low side power switch 220 (Q2), and driver 202. High side power switch 210 and low side power switch 220 may be implemented as silicon or other group IV based power MOSFETs, for example. Accordingly, high side power switch 210 is shown to include drain 212, source 214, and gate 216, while low side power switches 220 includes drain 222, source 22, and gate 226. According to the implementation shown in FIG. 2, driver 202 is coupled to gate 216 of high side power switch 210, and to gate 226 of low side power switch 220. As shown in FIG. 2, driver 202 may be configured to output gate drive 218 to gate 216 of high side power switch 210, as well as to output gate drive 246 to gate 226 of low side power switch 220

As further shown in FIG. 2, current sense circuit 240 is coupled across low side power switch 220. In other words, current sense circuit 240 has first sense input 242 coupled to drain 222 of low side power switch 220, and second sense input 244 coupled to source 224 of low side power switch 220. In addition, current sense circuit 240 is shown to receive gate drive 246 for low side power switch 220, and to provide sense output 248 to driver 202. It is noted that sense output 248 corresponds to a current through low side power switch 220. It is further noted that gate drive 246 provides power for current sense circuit 240, thereby eliminating the need for a dedicated VCC input to current sense circuit 240.

Also shown in FIG. 2 are voltage converter switch node 204 connecting source of high side power switch 210 to drain of low side power switch 220, output node 230, output inductor 206 coupled between switch node 204 and output node 230, and output capacitor 208. Voltage converter 200 may be implemented as a buck converter, for example, configured to receive a DC input voltage VIN at drain 212 of high side power switch 210 and to provide a stepped down output voltage VOUT at output node 230.

It is noted that although high side power switch 210 and low side power switch 220 are depicted as silicon or other group IV FETs in the interests of ease and conciseness of description, that representation is merely exemplary. The inventive principles disclosed herein are broadly applicable to a wide range of applications, including voltage converters implemented using other group IV material based, or group III-V semiconductor based, power switches. As used herein, the phrase "group III-V" refers to a compound semiconductor including at least one group III element and at least one group V element. By way of example, a group III-V semiconductor may take the form of a III-Nitride semiconductor that includes nitrogen and at least one group III element, such as gallium.

Thus, although in FIG. 2, MOSFETs are used to represent high side power switch 210 and low side power switch 220, in other implementations, other types of power switches, which may be high voltage (HV) power switches, can be used to provide either or both of high side power switch 210 and low side power switch 220. It is noted that HV, when used in reference to a transistor or switch describes a transistor or switch with a voltage range from approximately two hundred volts to approximately twelve hundred volts (approximately 200V to 1200V), or higher. It is also noted that use of the term midvoltage (MV) refers to a voltage range from approximately fifty volts to approximately two hundred volts (approximately 50V to 200V). Moreover, low voltage (LV), as used herein, refers to a voltage range of up to approximately fifty volts (50V).

The types of switches suitable for use as high side power switch 210 and low side power switch 220 may include bipolar junction transistors (BJTs), insulated-gate bipolar transistors (IGBTs), and gallium nitride (GaN) or other III-Nitride based high electron mobility transistors (HEMTs), for example. Moreover, in implementations in which low side power switch 220 takes the form of a BJT or IGBT, the feature identified by reference number 222 can be seen to correspond to a collector of low side power switch 220, while the feature identified by reference number 224 corresponds to an emitter of low side power switch 220.

It is further noted that in other implementations, current sense circuit 240 may be coupled across high side power switch 210 rather than across low side power switch 220. In yet other implementations, voltage converter 200 may include a first current sense circuit coupled across low side power switch 220, and a second current sense circuit coupled across high side power switch 210.

Figure 3:
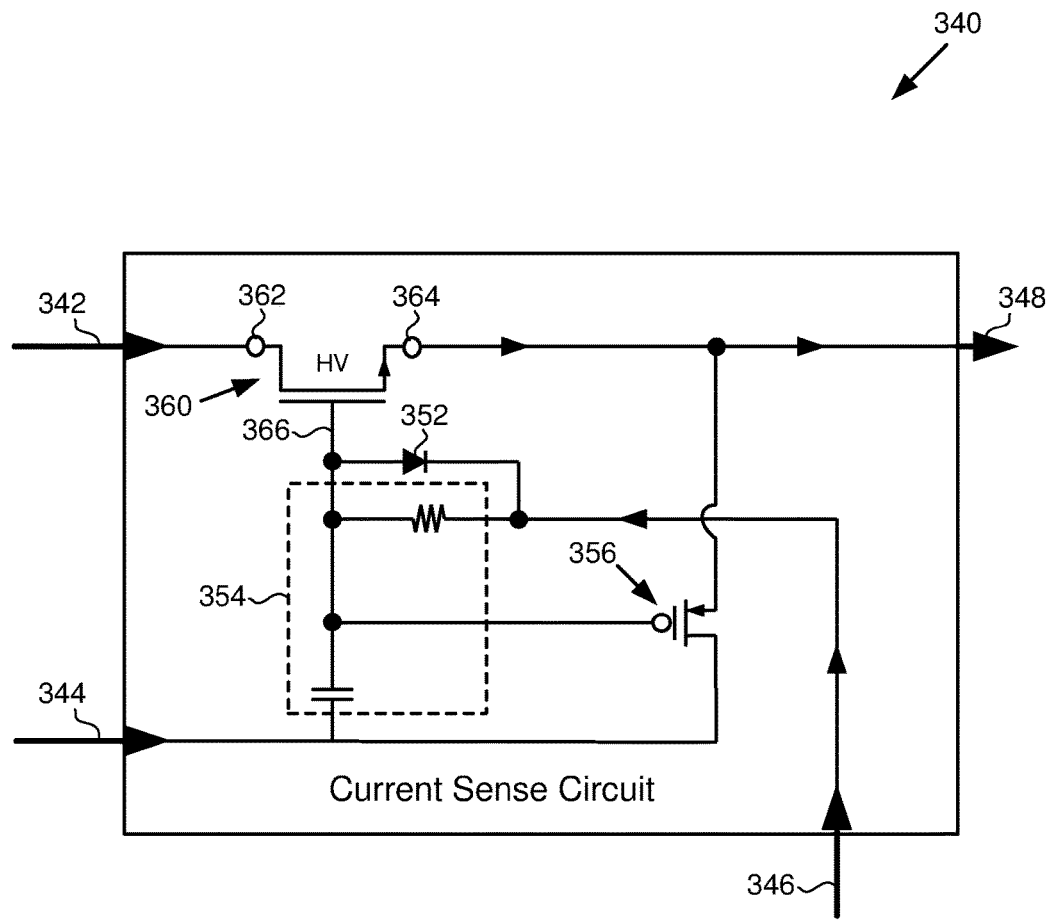
FIG. 3 shows a more detailed diagram of an exemplary gate drive powered current sense circuit suitable for use in the voltage converter of FIG. 2, according to one implementation.

The operation of current sense circuit 240 will be further described by reference to FIG. 3, which shows a more detailed diagram of an exemplary gate drive powered current sense circuit, according to one implementation. As shown in FIG. 3, gate drive powered current sense circuit 340 (hereinafter "current sense circuit 340") is configured to receive first sense input 342, second sense input 344, and gate drive 346, and to provide current sense output 348. Current sense circuit 340 receiving first sense input 342, second sense input 344, and gate drive 346, and providing current sense output 348, corresponds in general to current sense circuit 240 receiving first sense input 242, second sense input 244, and gate drive 246, and providing current sense output 248, in FIG. 2.

Current sense circuit 340 includes HV sense transistor 360 coupled between first sense input 342 and sense output 348. HV sense transistor 360 may be implemented as an HV FET, for example, having drain 362, source 364, and gate 366. Current sense circuit 340 also includes delay circuit 354 coupled to gate drive 346, pull-down transistor 356 situated between second sense input 344 and sense output 348, and discharge element 352, shown as discharge diode 352, coupled to gate 366 of HV sense transistor 360. As shown in FIG. 3, delay circuit 354 is configured to provide power for turning HV sense transistor 360 on when gate drive 346 is high. As further shown in FIG. 3, pull-down transistor 356, which may be an LV p-channel FET (PFET), for example, is configured to couple sense output 348 to second sense input 344 when gate drive 346 is low. It is noted that current sense circuit 340 may be implemented as an integrated circuit including HV sense transistor 360 and LV pull-down transistor 356 on a common chip or die.

Figure 4:
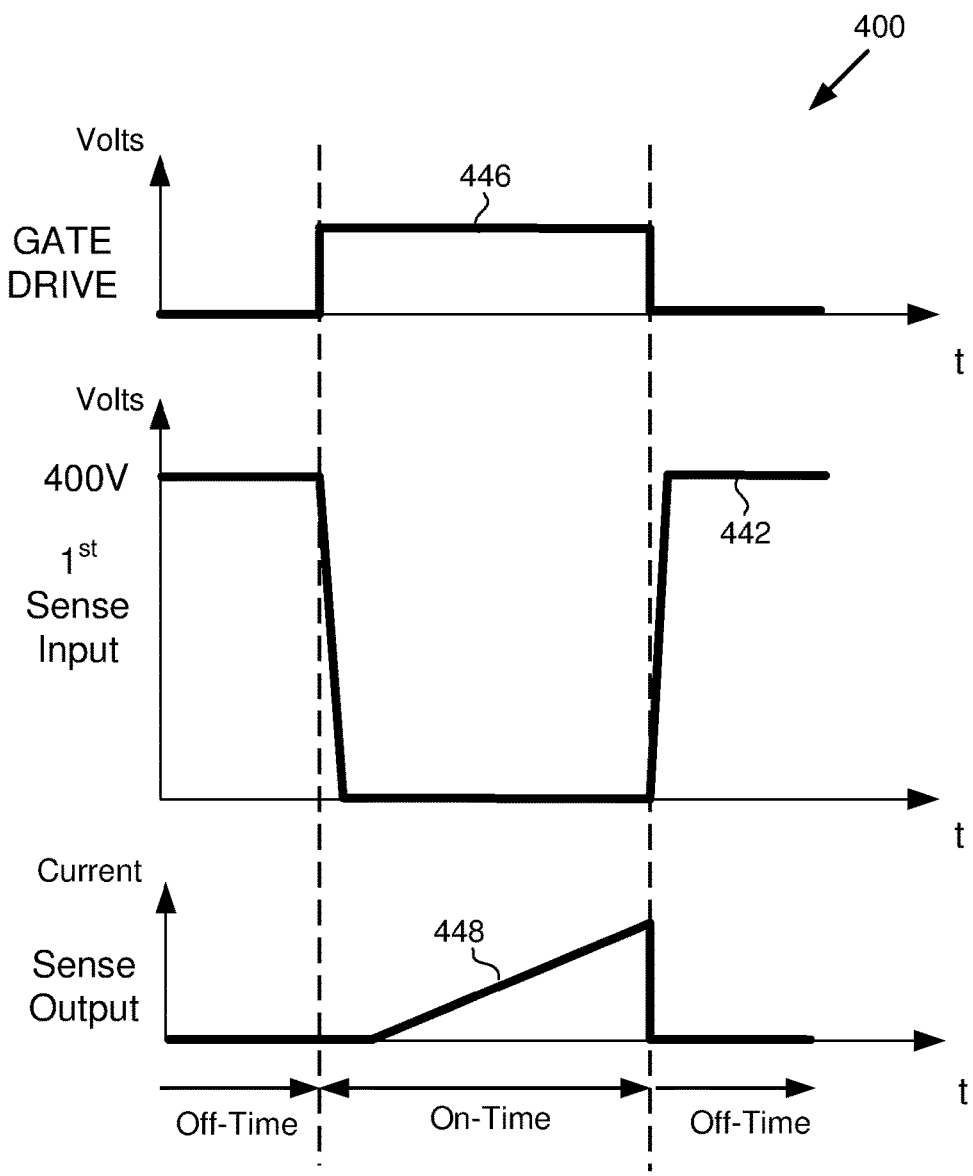
FIG. 4 shows a timing diagram depicting signals corresponding to a gate drive, a sense input, and a sense output of the exemplary gate drive powered current sense circuit shown in FIG. 3, according to one implementation.

Current sense circuit 240/340 in respective FIGS. 2/3 will be further described by additional reference to FIG. 4, which shows timing diagram 400 depicting gate drive signal 446, first sense input signal 442, and sense output signal 448, according to one implementation. Gate drive signal 446, first sense input signal 442, and sense output signal 448 correspond respectively to gate drive 246/346, first sense input 242/342, and sense output 248/348, in respective FIGS. 2/3.

Assuming that gate drive 246/346 is initially low, as shown by gate drive signal 446, low side power switch 220 and HV sense transistor 360 are off, and sense output 248/348 is forced to a low voltage by pull-down transistor 356, which is on when gate drive 246/346 is low. It is noted that sense output 248/348 is connected to second sense input 244/344 by pull-down transistor 356 when gate drive signal 446 is low. Second sense input 244/344 is, in turn, coupled to the low voltage (i.e., ground) at source 224 of low side power switch 220 when gate drive 246/346 is low.

According to the implementations shown in FIG. 2 and FIG. 3, drain 362 of HV sense transistor 360 is coupled to drain 222 of low side power switch 220 by first sense input 242/342. Drain 222 is typically at high voltage when low side power switch 220 is off. For example, drain 222 may see a voltage of approximately 400 V, or greater when low side power switch 220 is off. However, because HV sense transistor 360 is also off, the high voltage at drain 222 of low side power switch 220 is safely decoupled from any LV devices or circuitry in current sense circuit 240/340, such as pull-down transistor 356, by the drain-source voltage stand-off capability of HV sense transistor 360.

When gate drive signal 446 goes high, low side power switch 220 turns on, and the voltage at drain 222 reduces to a level given by the current flowing through low side power switch 220 multiplied by the RDSon of low side power switch 220, as shown by first sense input signal 442. After a short delay time imposed by delay circuit 354, gate drive 246/346 is coupled to and provides power to gate 366 of HV sense transistor 360, causing HV sense transistor 360 to turn on, while pull-down transistor 356 is turned off. It is noted that delay circuit 354 is configured to prevent current sense circuit 240/340 from providing sense output 248/348 until after low side power switch 220 turns on.

When HV sense transistor 360 turns on, sense output 248/348 is disconnected from second sense input 244/344, and is connected to first sense input 242/342 by HV sense transistor 360. That is to say, in implementations in which low side power switch 220 is a FET or HEMT, HV sense transistor 360 connects drain 222 of low side power switch 220 to sense output 248/348 when low side power switch 220 is on. Alternatively, in implementations in which low side power switch 220 is a BJT or IGBT, HV sense transistor 360 connects collector 222 of low side power switch 220 to sense output 248/348 when low side power switch 220 is on.

As a result, information about the current through low side power switch 220 is received at first sense input 242/342 and is transmitted across HV sense transistor 360 to sense output 248/348. Sense output signal 448 is the desired current sensing signal resulting from the current through low side power switch 220. When gate drive 246/346 once again switches low, low side power switch 220 turns off. Despite the presence of delay circuit 354, gate 366 of HV sense transistor 360 goes low quickly due to the operation of discharge element 352. That is to say, discharge element 352 enables HV sense transistor 360 to turn off substantially concurrently with gate drive 246/346 going low. In addition to turning low side power switch 220 and HV sense transistor 360 off, gate drive 246/346 going low further causes pull-down transistor 356 to turn on. As a result, sense output 248/348 is one again forced to a low voltage by being coupled to second sense input 244/344 by pull-down transistor 356.

According to the exemplary implementation shown in FIG. 2, drain 222 of low side power switch 220 is tied to switch node 204 of voltage converter 200, which in turn is coupled to output node 230 through output inductor 206. Consequently, and due to the exemplary implementation of FIG. 2, sense output signal 448 provided by sense output 248/348 will typically display the sawtooth waveform shown by sense output signal 448, in FIG. 4. Sense output 248/348 can then be fed to driver 202 for use in monitoring the current through low side power switch 220. It is noted, however, that in other voltage converter implementations, sense output signal 448 may assume a different waveform, such as a square wave, for example, than that shown in timing diagram 400.

It is further noted that because no dedicated VCC node is required for current sense circuit 240/340, current sense circuit 240/340 may be advantageously situated close to low side power switch 220. As a result the inputs to current sense circuit 240/340 may be locally connected to existing nodes for drain 222, source 224, and gate 226 of low side power switch 220 without the need for an additional dedicated VCC trace to a power rail of voltage converter 200.

Thus, by utilizing the on-resistance of a voltage converter power switch to sense the current through that power switch, the current sensing solution disclosed herein advantageously enables omission of a conventional current sense element connected in series with the power switch. As a result the power losses associated with use of conventional, series connected, current sense elements can be substantially eliminated. In addition, by implementing a gate drive powered current sense circuit, as disclosed herein, the present current sensing solution advantageously eliminates the need for a dedicated VCC input to the current sense circuit.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

What is claimed is:

1. A voltage converter comprising:
a driver providing a gate drive for a power switch; and
a sense circuit coupled across the power switch,
the gate drive providing power to the sense circuit, and
the sense circuit providing a sense output to the driver corresponding to a current through the power switch, wherein the sense circuit comprises a delay circuit to prevent the sense circuit from providing the sense output until after the power switch turns on.

2. The voltage converter of claim 1, wherein the sense circuit is configured to force the sense output to a low voltage when the power switch is off.

3. The voltage converter of claim 1, wherein the power switch comprises a group IV field-effect transistor (FET).

4. The voltage converter of claim 1, wherein the power switch comprises a III-Nitride high electron mobility transistor (HEMT).

5. The voltage converter of claim 1, wherein the sense circuit includes a high voltage (HV) sense transistor connecting a drain of the power switch to the sense output when the power switch is on.

6. The voltage converter of claim 1, wherein the power switch comprises an insulated-gate bipolar transistor (IGBT).

7. The voltage converter of claim 6, wherein the sense circuit includes a high voltage (HV) sense transistor connecting a collector of the power switch to the sense output when the power switch is on.

8. A method comprising:
providing, by a driver, a gate drive for a power switch;
providing power to a sense circuit by the gate drive, wherein the sense circuit is coupled across the power switch; and
providing, by the sense circuit, a sense output to the driver corresponding to a current through the power switch.

9. The method of claim 8, further comprising forcing, by the sense circuit, the sense output to a low voltage when the power switch is off.

10. The method of claim 8, further comprising preventing, by a delay circuit, the sense circuit from providing the sense output until after the power switch turns on.

11. The method of claim 8, wherein the power switch comprises a group IV field-effect transistor (FET).

12. The method of claim 8, wherein the power switch comprises a III-Nitride high electron mobility transistor (HEMT).

13. The method of claim 8, further comprising connecting, by a high voltage (HV) sense transistor of the sense circuit, a drain of the power switch to the sense output using when the power switch is on.

14. The method of claim 8, wherein the power switch comprises an insulated-gate bipolar transistor (IGBT).

15. The method of claim 14, further comprising connecting a collector of the power switch to the sense output using a high voltage (HV) sense transistor of the sense circuit when the power switch is on.

16. A method comprising:
outputting a gate drive using a driver coupled to a gate of a low side power switch, wherein the gate drive provides power to a sense circuit having a first sense input coupled to a drain of the low side power switch, and a second sense input coupled to a source of the low side power switch; and
providing, by the sense circuit, a sense output to the driver corresponding to a current through the low side power switch.

17. The method of claim 16, further comprising forcing, by the sense circuit, the sense output to a low voltage when the low side power switch is off.

18. The method of claim 16, further comprising preventing, using a delay circuit, the sense circuit from providing the sense output until after the low side power switch turns on.

19. The method of claim 16, further comprising providing power using the gate drive to a high voltage (HV) sense transistor of the sense circuit, wherein the gate drive is coupled to the HV sense transistor.

20. The method of claim 16, further comprising connecting the first sense input to the sense output using a high voltage (HV) sense transistor when the low side power switch is on.

* * * * *